US012470178B2

(12) United States Patent
Deng

(10) Patent No.: US 12,470,178 B2
(45) Date of Patent: Nov. 11, 2025

(54) HYBRID CONFIGURABLE RF POWER AMPLIFIER

(71) Applicant: Huawei Technologies Co., Ltd., Shenzhen (CN)

(72) Inventor: Jason Xiangdong Deng, Greensboro, NC (US)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 313 days.

(21) Appl. No.: 18/351,588

(22) Filed: Jul. 13, 2023

(65) Prior Publication Data
US 2023/0361721 A1 Nov. 9, 2023

Related U.S. Application Data

(63) Continuation of application No. PCT/US2021/013236, filed on Jan. 13, 2021.

(51) Int. Cl.
*H03F 1/32* (2006.01)
*H03F 1/56* (2006.01)
*H03F 3/24* (2006.01)

(52) U.S. Cl.
CPC .............. *H03F 1/32* (2013.01); *H03F 1/56* (2013.01); *H03F 3/245* (2013.01); *H03F 2200/222* (2013.01); *H03F 2200/387* (2013.01); *H03F 2200/451* (2013.01)

(58) Field of Classification Search
CPC ........ H03F 1/32; H03F 1/56; H03F 2200/222; H03F 2200/387; H03F 2200/451; H03F 3/195; H03F 3/211; H03F 3/245
See application file for complete search history.

(56) References Cited

U.S. PATENT DOCUMENTS

| 7,315,211 | B1 * | 1/2008 | Lee ...................... H03F 1/0227 330/285 |
| 2002/0132652 | A1 | 9/2002 | Steel et al. |
| 2006/0114062 | A1 | 6/2006 | Joly |
| 2007/0096823 | A1 | 5/2007 | Wang et al. |
| 2009/0039960 | A1 | 2/2009 | Park et al. |
| 2010/0127780 | A1 * | 5/2010 | An ......................... H03F 3/211 330/124 R |
| 2016/0118940 | A1 * | 4/2016 | Whittaker ............. H03F 1/0261 330/296 |
| 2018/0152145 | A1 | 5/2018 | Hase |
| 2020/0350881 | A1 * | 11/2020 | Wu ....................... H03F 1/0261 |

* cited by examiner

*Primary Examiner* — Nguyen T Vo
(74) *Attorney, Agent, or Firm* — Slater Matsil, LLP

(57) ABSTRACT

A radio frequency (RF) power amplifier is provided. In one aspect, the RF power amplifier includes a driver stage amplifier circuit, first and second power amplifier output stage circuits that each include a first and second array of bipolar junction transistors (BJTs), respectively, an inter-stage impedance matching network connecting the driver stage circuit's output to a respective first input of the first and second output stage circuits, and first and second bias circuits connecting the driver stage amplifier circuit's output to a respective second input of the first and second power amplifier output stage circuits. The first bias circuit and the first output stage circuit can set a quiescent point of each BJT in the first array to a first value, while the second bias circuit and the second output stage circuit are configured to set a quiescent point of each BJT in the second array to a second value.

18 Claims, 9 Drawing Sheets

HYBRID CONFIGURABLE RF POWER AMPLIFIER

CROSS-REFERENCE TO RELATED APPLICATIONS

This application is a continuation of International Patent Application No. PCT/US2021/013236, filed on Jan. 13, 2021, entitled "Hybrid Configurable RF Power Amplifier," application of which is hereby incorporated herein by reference in its entirety.

BACKGROUND

Radio frequency (RF) power amplifiers are used in modern digital telecommunications to amplify RF signals, e.g., for transmission by base stations and other devices. As communication bandwidth continues to come at a premium and more communication standards adopt RF power amplifier linearity requirements, it has become challenging to design RF power amplifiers that both maintain high linearity and leverage power saving techniques.

SUMMARY

The present disclosure generally relates to radio frequency (RF) power amplifiers.

The subject matter described in this specification can be implemented in particular embodiments to realize one or more of the following advantages. For example, in some implementations, by leveraging one or more of the RF power amplifier output stage configurations described herein, RF signal amplification may be performed with both high power-added efficiency (PAE) and high output power. As described below, in some such implementations, aspects of both an RF power amplifier output stage configured for deep class-AB operation (as described below) and an RF power amplifier output stage configured for high class-AB (as described below) operation may be incorporated into a single, hybrid RF power amplifier output stage architecture that is configured to operate in a manner so as to achieve both the PAE of an RF power amplifier that is configured for deep class-AB operation and the high output power of an RF power amplifier that is configured for high class-AB operation.

In general, one innovative aspect of the subject matter described in this specification can be embodied in an RF power amplifier that can include a driver stage amplifier circuit; a first power amplifier output stage circuit comprising a first array of bipolar junction transistors (BJTs); a second power amplifier output stage circuit comprising a second array of BJTs; an inter-stage impedance matching network connecting an output of the driver stage amplifier circuit to a first input of the first power amplifier output stage circuit and to a first input of the second power amplifier output stage circuit; a first bias circuit connecting the output of the driver stage amplifier circuit to a second input of the first power amplifier output stage circuit, wherein the first bias circuit and the first power amplifier output stage circuit are configured to set a quiescent point of each BJT in the first array of BJTs to a first value; and a second bias circuit coupled to a second input of the second power amplifier output stage circuit, wherein the second bias circuit and the second power amplifier output stage circuit are configured to set a quiescent point of each BJT in the second array of BJTs to a second value different from the first value.

The foregoing and other embodiments can each optionally include one or more of the features described herein, alone or in combination. In particular, one embodiment includes all the following features in combination.

In some implementations, the RF power amplifier can include a control circuit communicatively coupled to each of the first bias circuit and the second bias circuit, the control circuit configured to control the first and second power amplifier output stage circuits to switch between a first mode and a second mode. In some implementations, both the first and second power amplifier output stage circuits are activated in the first mode, while, in the second mode, the first power amplifier output stage circuit is activated and the second power amplifier output stage circuit is deactivated.

In some implementations, the control circuit of the RF power amplifier can be control the first and second power amplifier output stage circuits to switch between the first mode and the second mode by controlling one or more parameters of one or both of the first bias circuit and the second bias circuit to cause the first and second power amplifier output stage circuits to switch between the first mode and the second mode.

In some implementations, the control circuit of the RF power amplifier can control the one or more parameters of one or both of the first and second bias circuits based on a level of power of an RF signal that is to be provided as output.

In some implementations, the first and second bias circuits can include first and second DC current sources, respectively; and the one or more parameters of one or both of the first and second bias circuits can include an output current of the second DC current source.

In some implementations, the control circuit can receive a control signal specifying that the level of power of the RF signal exceeds a particular power threshold and in response to receiving the control signal specifying that the level of power of the RF signal exceeds the particular power threshold, the control circuit can control the first and second power amplifier output stage circuits to operate in the first mode.

In some implementations, the control circuit can receive a control signal specifying that the level of power of the RF signal is less than a particular power threshold; and in response to receiving the control signal specifying that the level of power of the RF signal is less than the particular power threshold, the control circuit can control the first and second power amplifier output stage circuits to operate in the second mode.

In some implementations, the second value can be greater than the first value.

In some implementations, in setting the quiescent point of each BJT in the second array of BJTs to the second value, the second bias circuit and the second power amplifier output stage circuit can cause each BJT in the second array of BJTs to operate in a class-AB mode.

In some implementations, the first bias circuit can include a first set of components, including a first load element located between one or more other components in the first set of components and the second input of the first power amplifier output stage circuit, the first load element having a first resistance value.

In some implementations, the second bias circuit can include a second set of components, including a second load element located between one or more other components in the second set of components and the second input of the second power amplifier output stage circuit, the second load element having a second resistance value that is less than the first resistance value.

In some implementations, the first bias circuit can provide a bias voltage to the second input of the first power amplifier output stage circuit.

In some implementations, the first bias circuit can include (1) an emitter follower circuit including a transistor, where the emitter follower circuit can provide a first voltage; and (2) a boost circuit that can sample an RF signal from the output of the driver stage amplifier circuit and pass the sampled RF signal to the emitter follower circuit for rectification from which a second voltage is generated, where the second voltage is proportional to a magnitude of a level of power exhibited by the RF signal and the bias voltage is a combination of the first voltage and the second voltage.

In some implementations, the RF power amplifier can include an output impedance matching network combining an output of the first power amplifier output stage circuit with an output of the second power amplifier output stage circuit.

The foregoing and other embodiments can each optionally include one or more of the features described herein, alone or in combination. In particular, one embodiment includes all the following features in combination.

The details of one or more embodiments of the subject matter of this specification are set forth in the accompanying drawings and the description below. Other features, aspects, and advantages of the subject matter will become apparent from the description, the drawings, and the claims.

DETAILED DESCRIPTION OF ILLUSTRATIVE EMBODIMENTS

Figure 1:
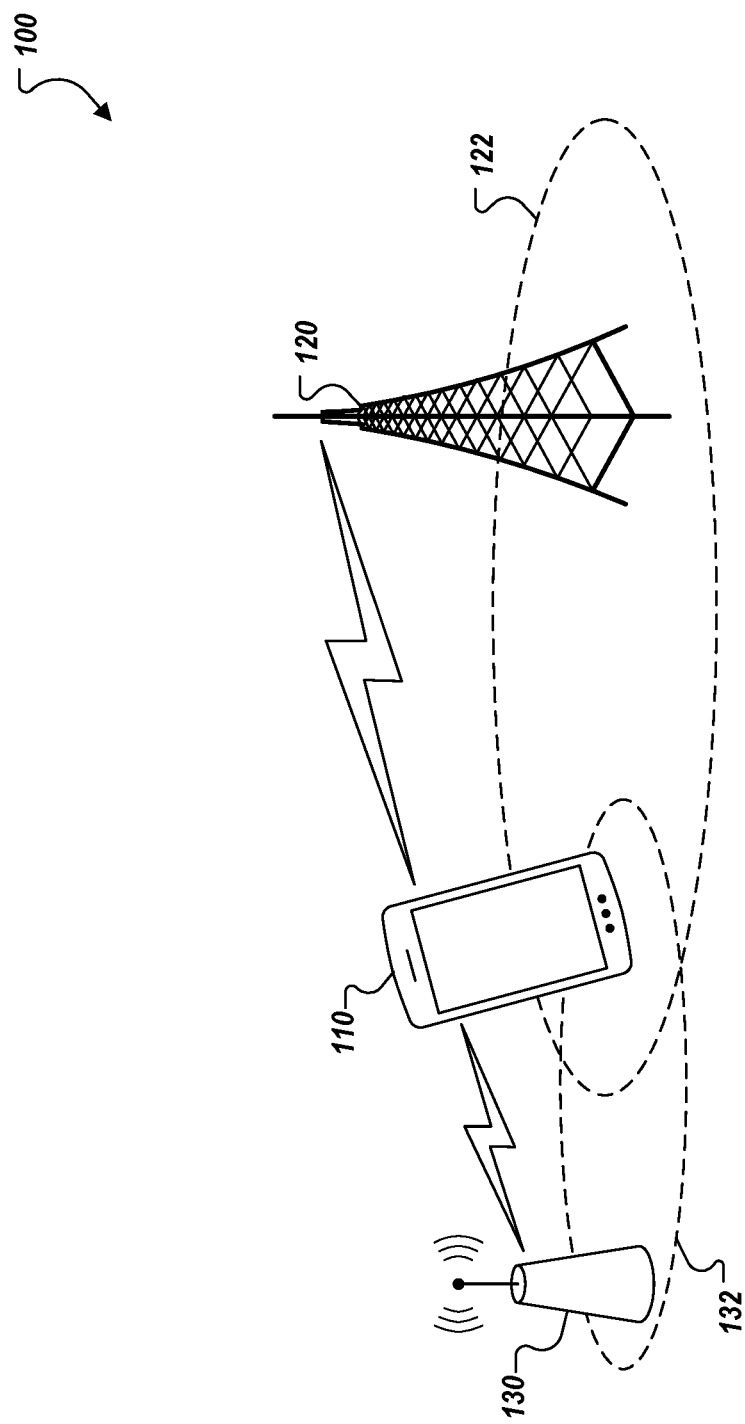
FIG. 1 is a block diagram of an example wireless communication system.

FIG. 1 is a block diagram of an example wireless communication system 100 including a wireless device 110 capable of communicating with one or more wireless communication networks. The one or more wireless communication networks with which the wireless device 110 is capable of communicating can include but is not limited to one or more cellular or wireless wide area networks (WWANs), one or more wireless local area networks (WLANs), one or more wireless personal area networks (WPANs), or a combination thereof.

In the example of FIG. 1, the wireless device 110 is communicating with at least one WWAN by way of at least one base station 120 and at least one WLAN by way of at least one access point 130. The at least one base station 120 can support bi-directional communication with wireless devices that are within its corresponding area of coverage 122. Similarly, the at least one access point 130 can support bi-directional communication with wireless devices that are within its corresponding area of coverage 132.

In some implementations, the at least one WWAN with which the at least one base station 120 is associated can be a fifth generation (5G) network among other generations and types of networks. In these implementations, the at least one base station 120 can be a 5G base station that employs orthogonal frequency-division multiplexing (OFDM) and/or non-OFDM and a transmission time interval (TTI) shorter than 1 ms (e.g. 100 or 200 microseconds), to communicate with wireless devices, such as wireless device 110. For example, the at least one base station 120 can take the form of one of several devices, such as a base transceiver station (BTS), a Node-B (NodeB), an evolved NodeB (eNB), a next (fifth) generation (5G) NodeB (gNB), a Home NodeB, a Home eNodeB, a site controller, an access point, or a wireless router, or a server, router, switch, or other processing entity with a wired or wireless network. In addition, and as shown in FIG. 1, wireless device 110 is configured to communicate with one or more personal area network (PAN) devices/systems 130 (e.g., Bluetooth® or radio frequency identification (RFID) systems and devices) over one or more WPANs.

System 100 can use multiple channel access functionality, including for example schemes in which the at least one base station 120 and the wireless device 110 are configured to implement the Long Term Evolution wireless communication standard (LTE), LTE Advanced (LTE-A), and/or LTE Multimedia Broadcast Multicast Service (MBMS). In other implementations, the at least one base stations 120 and wireless device 110 are configured to implement UMTS, HSPA, or HSPA+ standards and protocols. Of course, other multiple access schemes and wireless protocols can be utilized. In some examples, one or more such access schemes and wireless protocols can correspond to standards that impose RF power amplifier linearity requirements.

To communicate with one or both of the at least one base station 120 and the access point 130, the wireless device 110 can include one or more transmitters and receivers similar or equivalent to one or more of those described in further detail below with reference to FIG. 2 to support multiple communications with different types of access points, base stations, and other wireless communication devices. The transmitter of the wireless device 110 can include an RF power amplifier configured to amplify RF signals as needed for transmission to one or both of the at least one base station 120 and the access point 130. For instance, as the wireless device 110 moves toward an outer edge of the area of coverage 122 and further into the area of coverage 132, the transmitter of the wireless device 110 can leverage its RF power amplifier to transmit RF signals destined for the at least one WWAN with increased amplification to increase the likelihood that such RF signals reach the at least one base station 120 with minimal degradation. Additionally or alternatively, in this same scenario, the transmitter of the wireless device 110 can leverage its RF power amplifier to transmit RF signals destined for the at least one WLAN with reduced amplification so as to achieve power savings while sufficiently maintaining communication with the at least one access point 130. Examples of transmitters and RF power amplifiers that can be employed in wireless device 110 and other similar devices are described in further detail below with reference to FIGS. 2-6.

In some examples, the at least one base station 120 can receive RF signals from the wireless device 110, continuously or periodically determine a level of output power as needed for transmission based on the RF signals received from the wireless device 110, and transmit one or more messages specifying the determined level of output power to the wireless device 110. In response to receiving one or more such messages from the at least one base station 120, the wireless device 110 may make one or more amplification adjustments to transmit RF signals destined for the at least one WWAN at the level of power specified by the at least one base station 120. As such, the at least one base station 120 may, for example, instruct the wireless device 110 to transmit higher power signals when the wireless device 110 is located further away from the at least one base station 120 and instruct the wireless device 110 to transmit lower power signals when the wireless device 110 is located closer/nearer to the at least one base station 120. In this way, the wireless device 110 may be able to communicate with the at least one base station 120 in a sufficient, yet power efficient manner. In some examples, the determined level of output power that is specified in one or more messages that are sent to the wireless device 110 may correspond to "Pout" as described in further detail below with reference to FIGS. 5A-5B and 6. In some implementations, the at least one access point 130 or another device in communication with the wireless device 110 may be configured to instruct the wireless device 110 in a similar manner.

Although FIG. 1 illustrates one example of a communication system, various changes can be made to FIG. 1. For example, the communication system 100 could include any number of wireless devices, base stations, access points, networks, or other components in any suitable configuration.

Figure 2:
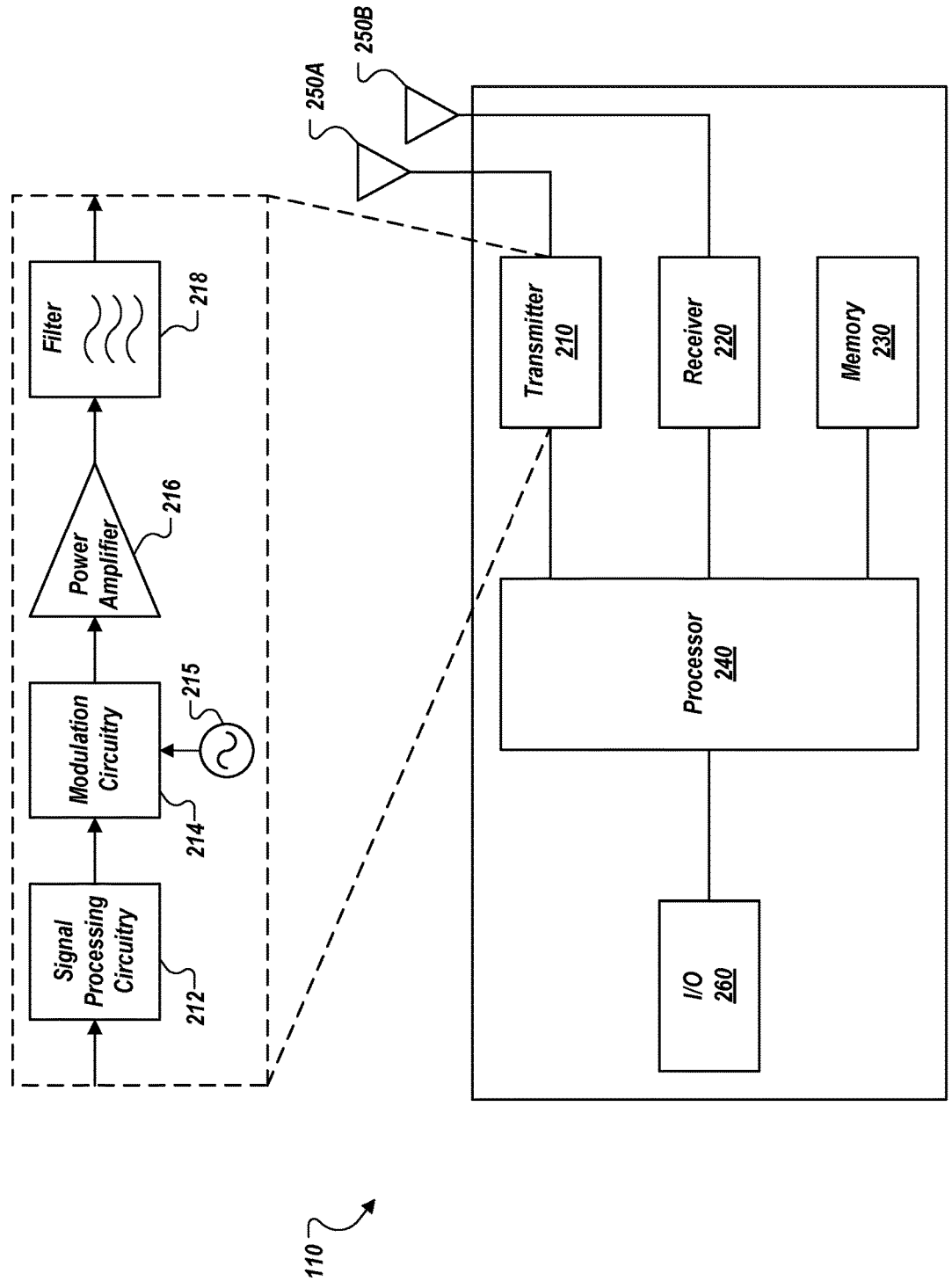
FIG. 2 is a block diagram of example details of a wireless device that may implement the methods and teachings according to this disclosure.

FIG. 2 is a block diagram that illustrates example details of the wireless device 110 that can implement the methods and teachings according to this disclosure. The wireless device 110 can, for example, be a mobile telephone, but can be other devices in further examples such as a desktop computer, laptop computer, tablet, hand-held computing device, automobile computing device and/or other computing devices. As shown in the figure, the wireless device 110 is shown as including at least one transmitter 210, at least one receiver 220, memory 230, at least one processor 240, and at least one input/output device 260. Here, only one transmitter and only one receiver are shown, but in many embodiments, multiple transmitters and receivers are included to support multiple communications of different types at the same time. Each transmitter may employ the innovations of the present disclosure.

The processor 240 can implement various processing operations of the wireless device 110. For example, the processor 240 can perform signal coding, data processing, power control, input/output processing, or any other functionality enabling the wireless device 110 to operate in the system 100 (FIG. 1). The processor 240 can include any suitable processing or computing device configured to perform one or more operations. For example, the processor 240 can include a microprocessor, microcontroller, digital signal processor, field programmable gate array, application specific integrated circuit, or a combination of these devices.

The transmitter 210 is configured to modulate data or other content for transmission by at least one antenna 250A. The transmitter 210 can also be configured to amplify, filter and upconvert baseband or intermediate frequency signals to radio frequency convert RF signals before such signals are provided to a power amplifier and then to antenna 250A for transmission. The transmitter 210 can include any suitable structure for generating signals for wireless transmission. Additional aspects of the transmitter 210 are described in further detail below with reference to components 212-218 as depicted in FIG. 2.

The receiver 220 can be configured to demodulate data or other content received by at least one antenna 250B. The receiver 220 can also be configured to amplify, filter and frequency convert RF signals received via the antenna 250B. The receiver 220 can include any suitable structure for processing signals received wirelessly.

Each of the antennas 250A and 250B can include any suitable structure for transmitting and/or receiving wireless signals. In some implementations, the antennas 250A and 250B can be implemented by way of a single antenna that can be used for both transmitting and receiving RF signals.

It is appreciated that one or multiple transmitters 210 could be used in the wireless device 110, one or multiple receivers 220 could be used in the wireless device 110, and one or multiple antennas 250 could be used in the wireless device 110. Although shown as separate blocks or components, at least one transmitter 210 and at least one receiver 220 could be combined into a transceiver. Accordingly, rather than showing a separate block for the transmitter 210 and a separate block for the receiver 220 in FIG. 2, a single block for a transceiver could have been shown.

The wireless device 110 further includes one or more input/output devices 260. The input/output devices 260 facilitate interaction with a user. Each input/output device 260 includes any suitable structure for providing information to or receiving information from a user, such as a speaker, microphone, keypad, keyboard, display, or touch screen.

In addition, the wireless device 110 includes at least one memory 230. The memory 230 stores instructions and data used, generated, or collected by the wireless device 110. For example, the memory 230 could store software or firmware instructions executed by the processor(s) 240 and data used to reduce or eliminate interference in incoming signals. Each memory 230 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

In some implementations, the transmitter 210 can include signal processing circuitry 212, modulation circuitry 214, a power amplifier 216, and at least one filter 218. The signal processing circuitry 212 may include one or more circuits that are configured to process signals received as input (e.g. from processor 240). For example, the signal processing circuitry 212 may include a digital-to-analog converter (D/A), which converts a digital input (e.g. from processor 240) into an analog signal, which is then provided to a low pass filter, which filters the analog signal and provides the filtered analog signal to the modulation circuitry 214. The modulation circuitry 214, in addition to receiving the filtered analog signal from the signal processing circuitry 212, also receives a signal from a local oscillator 215 and modulates or adjusts the frequency of the signal, e.g., from a first frequency to a second frequency that is higher than the first frequency. For instance, the modulation circuitry 214 may include a mixer that frequency up-converts the filtered analog signal from a relatively low frequency (e.g. baseband frequency, or an intermediate frequency (IF) that is offset from the baseband frequency) to a relatively high frequency RF signal. Thus, a signal from the local oscillator 215 is used as a carrier signal in transmitter 210. Moreover, as shown in FIG. 2, transmitter 210 includes an RF front end 217, which includes amplification and filtering circuits that filter and amplify the RF signal before providing the RF signal to the power amplifier 216.

The RF signal from the RF front end 217 is then amplified by the power amplifier 216 and filtered by the at least one filter 218 before being provided as output of the transmitter 210 to the at least one antenna 250A for wireless transmission. Although FIG. 2 shows the filter 218 as downstream from the power amplifier 216, in some implementations, the filter 218 can be upstream from the power amplifier 216 in which case the RF signal from the RF front end 217 is first filtered by the at least one filter 218 and then amplified by the power amplifier 216 before being provided as output of the transmitter 210 to the at least one antenna 250A for wireless transmission.

In some implementations, the power amplifier 216 corresponds to the RF power amplifier 300, the RF power amplifier 400, or the RF amplifier 500 as described in further detail below with reference to FIGS. 3A-3B, 4A-4B, and 5A-5B, respectively. In some such implementations, the wireless device 110 may be configured to make one or more of the amplification adjustments described above with reference to FIG. 1 responsive to receiving one or more messages specifying a level of output power, e.g., from the at least one base station 120, by adjusting one or more parameters of the power amplifier 216.

Figure 3A:
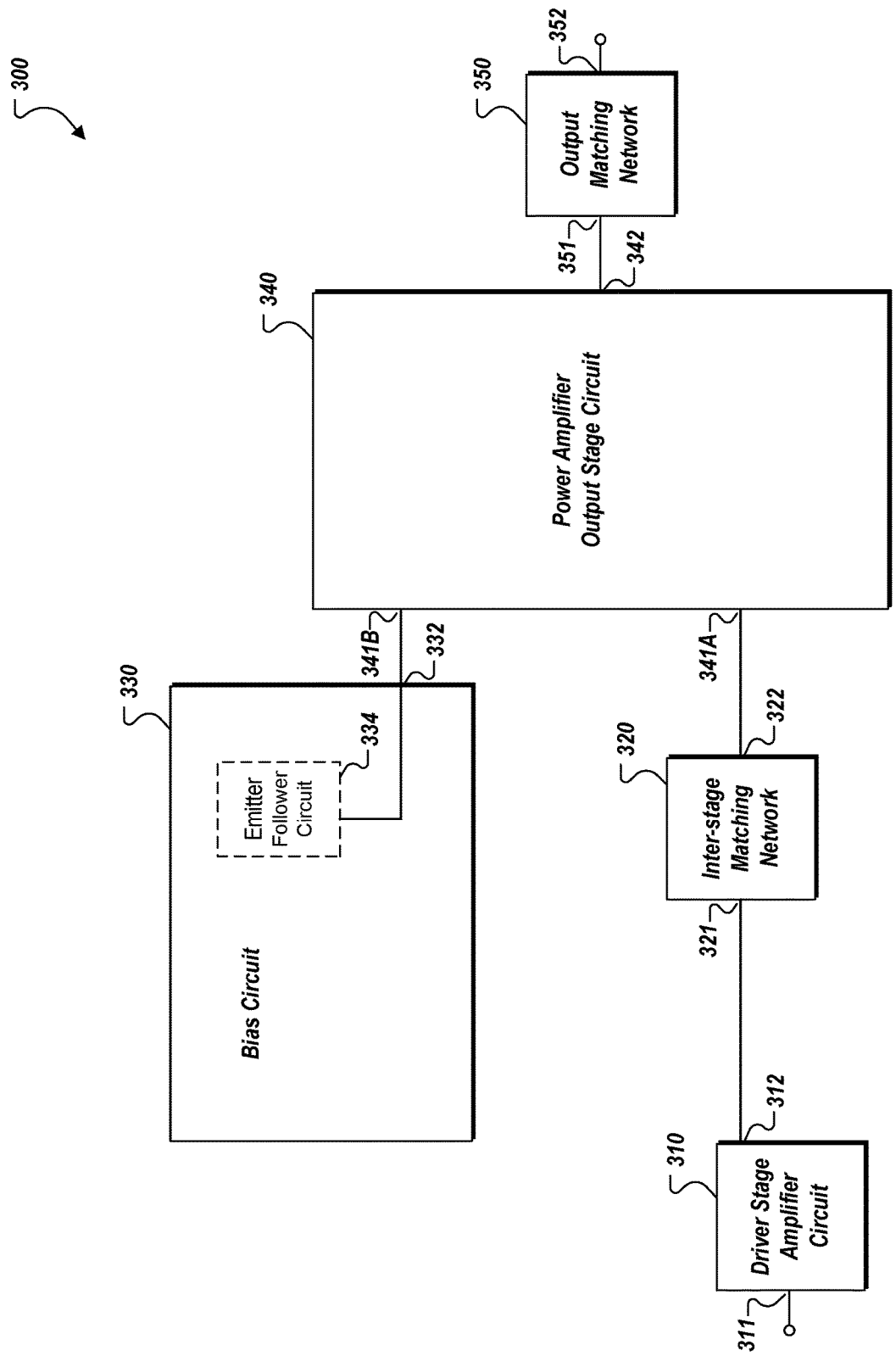
FIGS. 3A-3B are block diagrams of an example RF power amplifier.
Figure 3B:
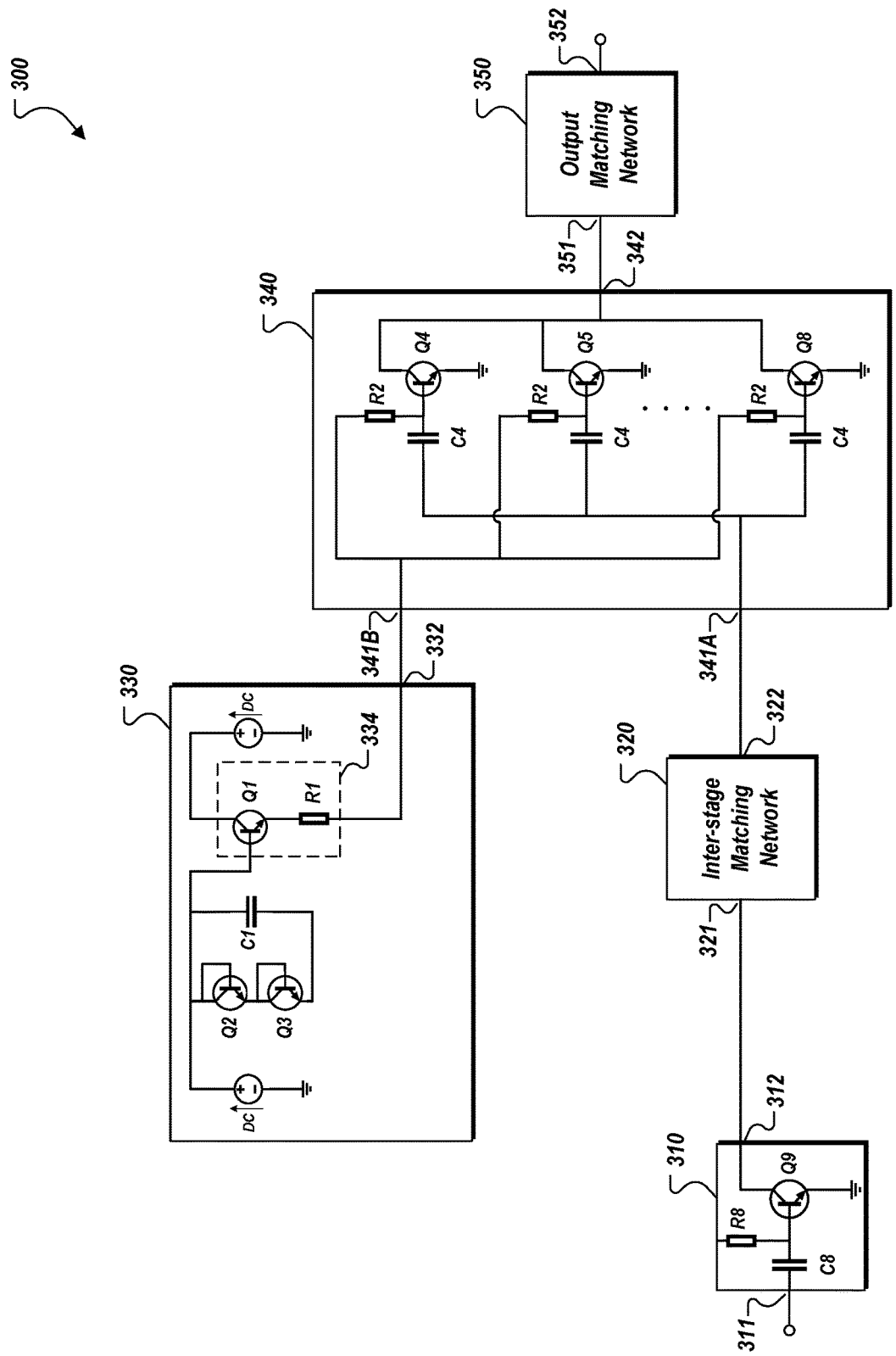

FIGS. 3A-3B are block diagrams of an example RF power amplifier 300. In the example of FIGS. 3A-3B, the RF power amplifier 300 includes a driver stage amplifier circuit 310, an inter-stage impedance matching network 320, a bias circuit 330, a power amplifier output stage circuit 340, and an output impedance matching network 350. The RF power amplifier 300 can be a multi-stage RF power amplifier, where the driver stage amplifier circuit 310 and the power amplifier output stage circuit 340 represent two adjacent amplifier stages that are connected by way of the inter-stage impedance matching network 320. As mentioned above, in some implementations, the RF power amplifier 300 can correspond to the power amplifier 216 as described above with reference to FIG. 2, which may be implemented in wireless device 110 as described above with reference to FIG. 1 or another similar wireless device.

The driver stage amplifier circuit or "stage" 310 is configured to receive an RF signal from one or more upstream components (e.g., the modulation circuitry 214) through its input 311, amplify the received RF signal, and transmit the amplified RF signal through its output 312. As shown in FIG. 3B, in some examples, the driver stage amplifier circuit 310 includes a capacitor C8 and a resistor R8 that are connected to a base terminal of an NPN bipolar junction transistor Q9.

The inter-stage impedance matching network 320 connects the output 312 of the driver stage amplifier circuit 310 to a first input 341A of the power amplifier output stage circuit 340. More specifically, the output 312 of the driver stage amplifier circuit 310 is connected to an input 321 of the inter-stage impedance matching network 320, and an output 322 of the inter-stage impedance matching network 320 is connected to the first input 341A of the power amplifier output stage circuit 340. In general, the inter-stage impedance matching network 320 is configured to perform impedance matching to resolve a mismatch in impedance between the driver stage amplifier circuit or "stage" 310 and the power amplifier output stage circuit or "stage" 340. The inter-stage impedance matching network 320 can include one or more circuits that include one or more resistors, one or more capacitors, one or more inductors, or a combination thereof. Other configurations are possible.

The power amplifier output stage circuit or "stage" 340 is configured to receive the RF signal as amplified by the driver stage amplifier circuit 310 from the inter-stage impedance matching network 320 through its first input 341A, amplify the received RF signal, and transmit the amplified RF signal through its output 342. As shown in FIG. 3B, in some examples, the power amplifier output stage circuit 340 includes an array of amplifier circuits, each of which includes a respective capacitor C4 and a respective resistor R2 that are connected to a base terminal of a respective NPN bipolar junction transistor (BJT). In general, resistors R2 and other resistors described herein may represent examples of load elements. As such, resistors R2 and other resistors described herein are, in some instances, referred to as load elements.

Given that the relationship between input and output for a BJT is not linear across its full operating range, each amplifier circuit of the power amplifier output stage circuit 340 approximates linear operation. In order to minimize distortion, each BJT of the power amplifier output stage circuit 340 is biased to prevent each BJT from being driven into a region of extremely nonlinear operation. In some examples, the bias circuit 330 can be leveraged to provide such biasing functionality. Thus, by utilizing a plurality of amplifiers biased as described in an array, the power amplifier circuit 340, as a whole, produces a linear output to satisfy linearity requirements.

The bias circuit 330 is configured to provide a bias voltage through its output 332 to a second input 341B of the power amplifier output stage circuit 340. In general, the bias voltage provided by the bias circuit 330 can bias the BJTs in the array of amplifier circuits of the power amplifier output stage circuit 340 in a manner so that each BJT operates in a particular region of its respective transconductance curve. In some implementations, the bias circuit 330 includes an emitter follower circuit 334. More specifically, as shown in FIG. 3B, the emitter follower circuit 334 can include an NPN BJT Q1 that is connected to one or more components in an emitter follower or "common collector" configuration, such as a resistor R1. While the resistor R1 can represent an "emitter resistor" of the emitter follower circuit 334, it can additionally or alternatively represent a biasing resistor that serves to dictate (at least in part) the current and/or voltage with which the power amplifier output stage circuit 340 is biased. The bias circuit 330 also can include one or more DC current sources and one or more components that are coupled to the base and collector terminals of the NPN BJT Q1. In some implementations, one or more of the aforementioned BJTs of the RF power amplifier 300 are heterojunction bipolar transistors (HBTs).

The output impedance matching network 350 connects the output 342 of the power amplifier output stage circuit 340 to one or more downstream components (e.g., the at least one filter 218, the at least one antenna 250A, etc.). More specifically, the output 342 of the power amplifier output stage circuit 340 is connected to an input 351 of the output impedance matching network 350, and an output 352 of the output impedance matching network 350 is connected to one or more inputs of one or more components downstream from the RF power amplifier 300, such as one or more filters, one or more antennas, or a combination thereof. In general, the output impedance matching network 350 is configured to perform impedance matching to provide a desired load to the power amplifier output stage circuit 340 from one or more downstream components. Much like the inter-stage impedance matching network 320, the output impedance matching network 350 can include one or more circuits that include one or more resistors, one or more capacitors, one or more inductors, or a combination thereof. Other configurations are possible.

Referring once again to the power amplifier output stage circuit 340, in some applications, it may be advantageous to employ resistors that have relatively high resistance values for resistors R2 in the power amplifier output stage circuit 340. For instance, by employing resistors that have relatively high resistance values for resistors R2 in the power amplifier output stage circuit 340, the resistors R2 evenly distribute the DC bias provided by the bias circuit 330 across the array of amplifier output stage circuits in the power amplifier output stage circuit 340 to more effectively prevent or reduce the likelihood of current or thermal runaway in the power amplifier output stage circuit 340. In this way, the resistors R2 may effectively serve as ballasting resistors for the power amplifier output stage circuit 340. In some examples, the value of each resistor R2 may be greater than a minimum value determined based on the specifications of one or more components in the power amplifier output stage circuit 340, such as the BJTs. For example, each resistor R2 may have a resistance value of around 400Ω. In some implementations, each resistor R2 can have a minimum resistance value of about 300Ω.

In general, the quiescent current to which the BJTs in the power amplifier output stage circuit 340 are set is inversely related to the load yielded by upstream components, such as resistors R1 and R2 in the bias circuit 330 and the power amplifier output stage circuit 340. As such, the greater the resistance of resistor R1 is in value, the lesser the quiescent current to which the BJTs in the power circuit 340 are set may be in value, and vice versa. In some implementations, the resistance value of resistor R1 may be selected such that the bias circuit 330 and the power amplifier output stage circuit 340 are configured to set the quiescent current of each BJT in the power amplifier output stage circuit 340 to a value that falls within a range of quiescent current values that are associated with class-AB operation. In other words, in such implementations, the resistance value of resistor R1 may at least in part cause each BJT in the power amplifier output stage circuit 340 to operate in a class-AB mode.

While setting the quiescent current of the BJTs in the power amplifier output stage circuit 340 to any value that falls within a range of quiescent current values that are associated with class-AB operation may serve to reduce power consumption and boost the power-added efficiency (PAE) of the RF power amplifier 300, setting the quiescent current of such BJTs to values that are on the lower end of the range of quiescent current values that are associated with class-AB operation may serve to further reduce power consumption and boost the PAE of the RF power amplifier 300 (such a mode of operation is at times referred to herein as a "deep class-AB" mode of operation). This is because, in deep class-AB mode, the conduction angle of the RF power amplifier is lower than its conduction angle in the class-AB mode (e.g., in deep class-AB mode, the conduction angle can be less than or equal to 180 degrees, while in class-AB mode, the conduction angle ranges between 180 and 360 degrees), and a lower conduction angle generally results in higher efficiency for the RF power amplifier (i.e., reduced power consumption and boosted PAE).

In view of the aforementioned advantages, in at least some applications, it may be desirable to select the resistance value of resistor R1 so as to at least in part cause each BJT in the power amplifier output stage circuit 340 to operate in a deep class-AB mode. Given the general relationship between resistor R1 and the quiescent current to which the BJTs in the power amplifier output stage circuit 340 are set, the resistance value of resistor R1 may need to be relatively high to place the BJTs in the power amplifier output stage circuit 340 in a deep class-AB mode of operation. The resistance provided by resistors R2 in parallel can also serve to help place the BJTs of the power amplifier output stage circuit 340 in the deep class-AB mode. However, employing resistors that have relatively high resistance values as resistors R1 and R2 in the bias circuit 330 and the power amplifier output stage circuit 340 also can, in some implementations, introduce significant bias modulation at the base terminal of each BJT in the power amplifier output stage circuit 340 and thus cause significant nonlinear distortion. Examples of the types of adverse effects that might be produced in the RF power amplifier 300 include amplitude-to-amplitude modulation (AM/AM) and amplitude-to-phase modulation (AM/PM). Moreover, as RF output power is increased during operation, the power amplifier output stage circuit 340 may demand additional current, which may result in an undesired dropping of the DC bias voltage at the base terminal of each BJT in the power amplifier output stage circuit 340, which may cause a collapse in gain or early compression. This early compression may significantly degrade the linear performance of the power amplifier output stage circuit 340 and force the RF power amplifier 300 to operate with less current, which can be highly inefficient. Given that linearity has bearing on communication bandwidth and must also meet certain requirements under many modern wireless communications protocols (e.g., WCDMA, LTE, 5G, Wi-Fi, etc.), employing ballasting and biasing resistors that have relatively high resistance values may be difficult to achieve or yield poor performance in many RF power amplifier systems.

In some implementations, one or more of the RF power amplifier configurations described in further detail below can be leveraged to achieve the benefits that come with employing ballasting and biasing resistors that have relatively high resistance values without substantially sacrificing linearity.

Figure 4A:
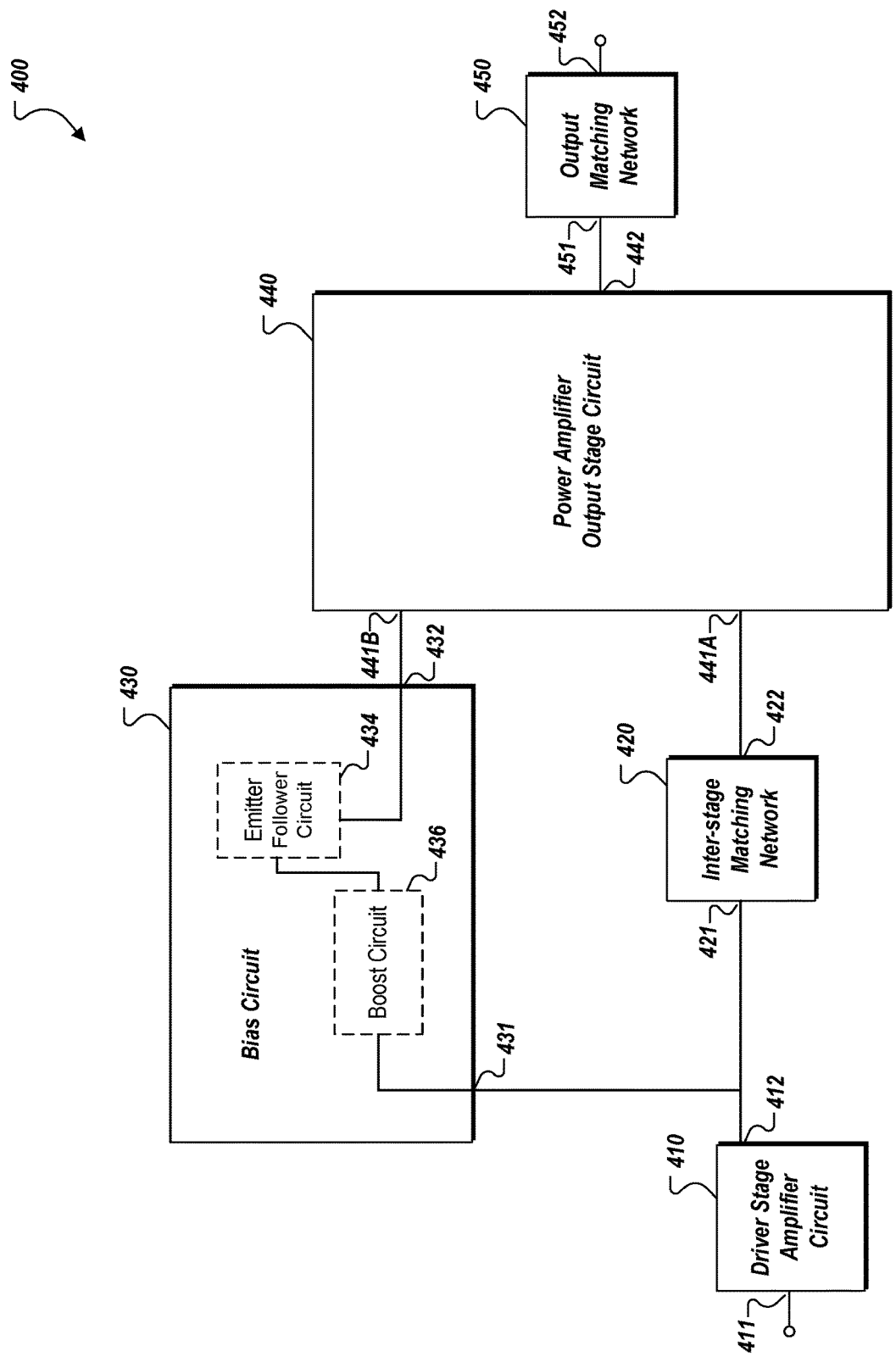
FIGS. 4A-4B are block diagrams of an example linearity-preserving RF power amplifier.
Figure 4B:
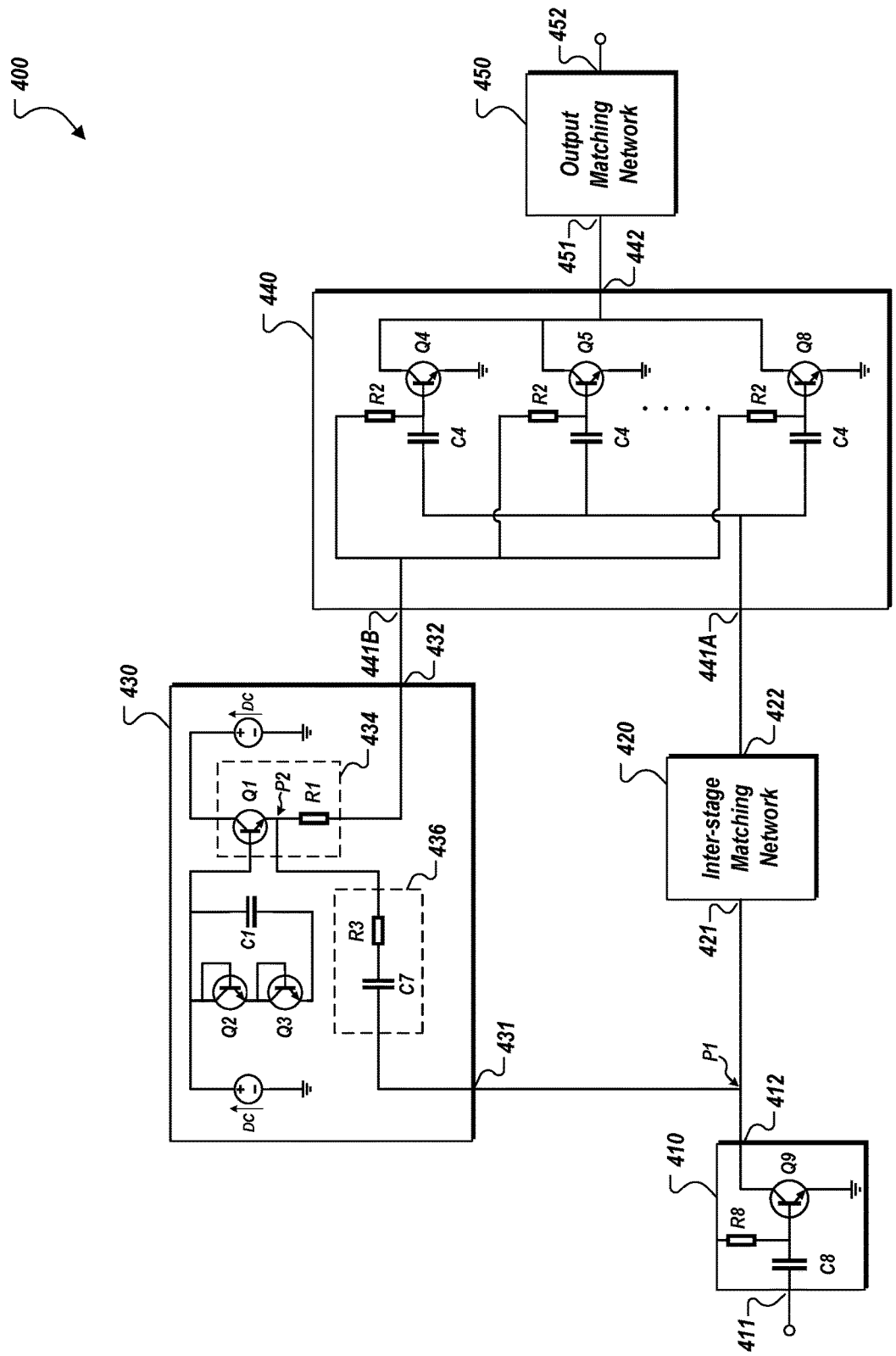

FIGS. 4A-4B are block diagrams of an example linearity-preserving RF power amplifier 400. In the example of FIGS. 4A-4B, the RF power amplifier 400 includes a driver stage amplifier circuit 410, an inter-stage impedance matching network 420, a bias circuit 430, a power amplifier output stage circuit 440, and an output impedance matching network 450. In some implementations, each of one or more of elements 410-430, 432, 434, and 440-452 as depicted in FIGS. 4A-4B is similar or equivalent to each of one or more of elements 310-330, 332, 334, and 340-352 as depicted in FIGS. 3A-3B, respectively. As mentioned above, in some implementations, the linearity-preserving RF power amplifier 400 can correspond to the power amplifier 216 as described above with reference to FIG. 2, which may be implemented in wireless device 110 as described above with reference to FIG. 1 or another wireless device.

In the example of FIGS. 4A-4B, the bias circuit 430 includes a boost circuit 436. The boost circuit 436 is configured to sample the RF signal output by the driver stage amplifier circuit 410 and pass the sampled RF signal to the emitter follower circuit 434 of the bias circuit 430. More specifically, as shown in FIG. 4B, the boost circuit 436 connects two points in the RF power amplifier 400 including (i) a first point P1 located between the output 412 of the driver stage amplifier circuit 410 and the first input 441A of the power amplifier output stage circuit 440, and (ii) a second point P2 located between the NPN BJT Q1 in the emitter follower circuit 434 and the resistor R1 of the bias circuit 430 (e.g., at the emitter terminal of the NPN BJT Q1). For example, the first point P1 may be located between the output 412 of the driver stage amplifier circuit 410 and the input 421 of the inter-stage impedance matching network 420, or may be located between the input 421 of the inter-stage impedance matching network 420 and the output 422 of the inter-stage impedance matching network 420 (i.e., within the inter-stage impedance matching network 420).

As described in FIG. 4B, the bias circuit 430 is configured to provide a bias voltage through its output 432 to a second input 441B of the power amplifier output stage circuit 440. As shown in FIG. 4B, bias circuit 430 includes diode-collected bipolar transistors Q2 and Q3 (collectively labeled as 439), and when a DC current is injected into Q2 and Q3, a voltage is formed at node 438. This voltage is reduced by the voltage from the NPN BJT Q1 in the emitter follower circuit 434, resulting in the bias voltage at P2, which is provided via output 432 to the power amplifier output stage circuit.

By virtue of the emitter follower or "common collector" configuration of the NPN BJT Q1 and other components in the bias circuit 430, once passed to the emitter follower circuit 434 of the bias circuit 430, the sampled RF signal is rectified to become an additional DC voltage with which the power amplifier output stage circuit 440 is biased. That is, in this configuration, the PN junction between the base and emitter terminals of Q1 acts like a diode from which an additional DC voltage proportional to the magnitude of the power of the sampled RF signal is generated. The "boost" that is provided by this additional DC voltage may serve to effectively compensate for nonlinear distortion introduced at least in part by way of resistors R1 and R2. As such, the RF power amplifier 400 may employ resistors that have higher resistance values relative to resistors R1 and R2 in the bias circuit 430 and the power amplifier output stage circuit 440 to combat current or thermal runaway in the power amplifier output stage circuit 440. This also achieves power savings and enhanced PAE by causing the BJTs of the power amplifier output stage circuit 440 to operate in a deep class-AB mode, and the boost circuit 436 may serve to preserve linearity in the power amplifier output stage circuit 440, which might otherwise be threatened by the relatively high resistance values of resistors R1 and R2. For example, resistors R1 and R2 as implemented in the RF power amplifier 400 may have resistance values of 120Ω and 400Ω, respectively.

As shown in FIG. 4B, the boost circuit 436 can include a capacitor C7 arranged in series with a resistor R3. The values of capacitor C7 and resistor R3 can be selected based on a variety of different factors. For instance, in some implementations, the value of capacitor C7 is selected based at least in part on the frequency at which the RF signal is modulated upstream from the RF power amplifier 400. Within the context of FIG. 2, this might correspond to the frequency of the signal that is produced by the local oscillator 215. While the arrangement of capacitor C7 and resistor R3 in the boost circuit 436 represents one type of passive filter, in some examples, the boost circuit 436 can include one or more components that form or otherwise represent another type of passive filter. In some implementations, the boost circuit 436 can include only capacitor C7 and not include resistor R3. Other configurations are possible.

Thus, in this manner, the emitter follower circuit 434 and the boost circuit 436 are configured to cooperatively produce an additional DC voltage at the emitter terminal of NPN BJT Q1 that is proportional to the output power of the driver stage amplifier output stage circuit 410. In this way, the voltage across the base and emitter terminals of a given transistor in the power amplifier output stage circuit 440 may exhibit far less variance than the voltage across the base and emitter terminals of a given transistor in the power amplifier output stage circuit 340 may exhibit if a relatively high-value resistor were to be employed as R1 in systems 300 and 400. Moreover, the emitter follower circuit 434 and the boost circuit 436 offer improved compensation for nonlinear distortion and DC bias voltage drooping introduced at least in part by ballasting and biasing resistors with relatively high resistance values, e.g., R1 and R2.

Indeed, in view of the foregoing, the RF power amplifier 400 may be well suited for "deep" class-AB operation, where the bias circuit 430 and the power amplifier output stage circuit 440 are configured to set the quiescent current of each BJT in the power amplifier output stage circuit 440 to a value that is on the lower end of the range of quiescent current values that are associated with class-AB operation. As such, in some examples, a resistor $R_D$ may be employed as resistor R1 in the bias circuit 430, where resistor $R_D$ represents a resistor that, when employed as resistor R1 in one of the bias circuits described herein, at least in part causes each BJT in the corresponding power amplifier output stage circuit to operate in a deep class-AB mode.

On the other hand, the RF power amplifier 300 as described above with reference to FIGS. 3A-3B, which, unlike the RF power amplifier 400, does not include circuitry akin to boost circuit 436, may instead be better suited for "high" class-AB operation, where the bias circuit 330 and the power amplifier output stage circuit 340 are configured to set the quiescent current of each BJT in the power amplifier output stage circuit 340 to a value that is on the upper end of the range of quiescent current values that are associated with class-AB operation. As such, for some examples in which the RF power amplifier 300 is utilized, a resistor RH may be employed as resistor R1 in the bias circuit 330, where resistor RH represents a resistor that, when employed as resistor R1 in one of the bias circuits described herein, at least in part causes each BJT in the corresponding power amplifier output stage circuit to operate in a high class-AB mode.

It follows that the resistance value of resistor Rn would be less than that of resistor $R_D$ as described above. In some implementations, the resistance value of resistor $R_D$ may, for instance, be two to four times greater than the resistance value of resistor RH. For example, resistor $R_D$ may have a resistance value of around 120Ω, while resistor $R_D$ may have a resistance value of around 36.7Ω. Other resistance values are possible.

The PAE of an RF power amplifier that is configured for deep class-AB operation, such as the RF power amplifier 400 in one or more implementations where resistor $R_D$ is employed as resistor R1 in the bias circuit 430, may indeed be superior to that of an RF power amplifier that is configured for high class-AB operation or that is otherwise not configured for deep class-AB operation. For at least this reason, in some implementations, it may be highly desirable to leverage an RF power amplifier that is configured for deep class-AB operation, such as the RF power amplifier 400 in one or more implementations where resistor $R_D$ is employed as resistor R1 in the bias circuit 430, as the power amplifier 216 in wireless device 110 as described above with reference to FIGS. 1-2.

As described above with reference to FIGS. 1-2, in some such implementations, the wireless device 110 may be configured to make one or more of the amplification adjustments described above with reference to FIG. 1 responsive to receiving one or more messages specifying a level of output power, e.g., from the at least one base station 120, by adjusting one or more parameters of the power amplifier 216, e.g., the RF power amplifier 400 as configured for deep class-AB operation. As such, the at least one base station 120 may, for example, instruct the wireless device 110 to transmit higher power signals when the wireless device 110 is located further away from a base station 120, e.g., closer to the outer edge of the area of coverage 122, and instruct the wireless device 110 to transmit lower power signals when the wireless device 110 is located closer to a base station 120. However, in some examples, the saturated output power of such an RF power amplifier configured for deep class-AB operation, which may correspond to the maximum level of power that such an RF power amplifier can deliver at its output, may not be high enough, for instance, so as to enable wireless device 110 to amplify RF signals as needed for transmission to the at least one base station 120 as the wireless device 110 nears the outer edge of the area of coverage 122. That is, in some examples, the level of output power specified in one or more messages sent to the wireless device 110 by the at least one base station 120 may, at times, be greater than the maximum level of output power that such an RF power amplifier is capable of delivering.

On the other hand, the saturated output power of an RF power amplifier that is configured for high class-AB operation, such as the RF power amplifier 300 in one or more implementations where resistor RH is employed as resistor R1 in the bias circuit 330, may be high enough, for instance, so as to enable wireless device 110 to amplify RF signals as needed for transmission to the at least one base station 120 as the wireless device 110 nears the outer edge of the area of coverage 122. However, as previously mentioned, such an RF power amplifier that is configured for high class-AB operation may be less power-efficient than an RF power amplifier that is configured for deep class-AB operation.

In some implementations, one or more of the RF power amplifier configurations described in further detail below with reference to FIGS. 5A-5B and 6 can be leveraged to achieve both the PAE of an RF power amplifier that is configured for deep class-AB operation and the high output power of an RF power amplifier that is configured for high class-AB operation. As described below, in some such implementations, aspects of both an RF power amplifier configured for deep class-AB operation and an RF power amplifier configured for high class-AB operation may be incorporated into a single, hybrid configurable RF power amplifier architecture.

Although, as mentioned above, the saturated output power of such an RF power amplifier configured for deep class-AB operation may not be high enough, for instance, so as to enable wireless device 110 to amplify RF signals as needed for transmission to the at least one base station 120 as the wireless device 110 nears the outer edge of the area of coverage 122, the saturated output power of such an RF power amplifier configured for deep class-AB operation may be high enough so as to enable wireless device 110 to amplify RF signals as needed for transmission to the at least one base station 120 as the wireless device 110 for the vast majority of the time. Indeed, often the level of output power specified in one or more messages sent to the wireless device 110 by the at least one base station 120 may be less than the saturated output power of such an RF power amplifier configured for deep class-AB operation.

As such, in some implementations, one or more of the hybrid RF power amplifier configurations described in further detail below may include circuitry for deep class-AB operation and circuitry for high class-AB operation, but may only need to utilize the circuitry for high class-AB operation, e.g., in situations where the wireless device 110 is located near or at the outer edge of the area of coverage 122. In such situations, the circuitry for high class-AB operation may be utilized in tandem with the circuitry for deep class-AB operation. The rest of the time, one or more of the hybrid RF power amplifier configurations described in further detail below may only utilize circuitry for deep class-AB operation. In this way, one or more of the hybrid RF power amplifier configurations described in further detail below may most often operate in a highly power-efficient manner. Moreover, like many RF power amplifiers, the PAE of an RF power amplifier configured for high class-AB operation may increase as the level of output power delivered by the RF power amplifier increases. As such, when the circuitry for high class-AB operation is occasionally utilized, such circuitry may operate at peak or near-peak PAE.

In some implementations, one or more of the hybrid RF power amplifier configurations described in further detail below may be configured to selectively switch between (i) a first mode in which both the circuitry for deep class-AB operation and the circuitry for high class-AB operation are utilized or otherwise activated, and (ii) a second mode in which the circuitry for deep class-AB operation is utilized or is otherwise activated and the circuitry for high class-AB operation is not utilized or is otherwise deactivated. For example, one or more of the hybrid RF power amplifier configurations described in further detail below may be configured to control the aforementioned circuitry to (i) operate in the first mode when the level of output power specified in one or more messages sent to the wireless device 110 by a base station 120 is greater than a threshold value, and (ii) operate in the second mode when the level of output power specified in one or more messages sent to the wireless device 110 by a base station 120 is less than a threshold value. In some implementations, the logic and functionality for selectively switching between the first and second modes may be provided by way of one or more components that are similar or equivalent to control circuit 570 as described in further detail below with reference to FIGS. 5A-5B. Examples of the aforementioned circuitry for deep class-AB operation are described in further detail below with reference to components 530-1 and 540-1 in FIGS. 5A-5B. Similarly, examples of the aforementioned circuitry for high class-AB operation are described in further detail below with reference to components 530-2 and 540-2 in FIGS. 5A-5B.

Figure 5A:
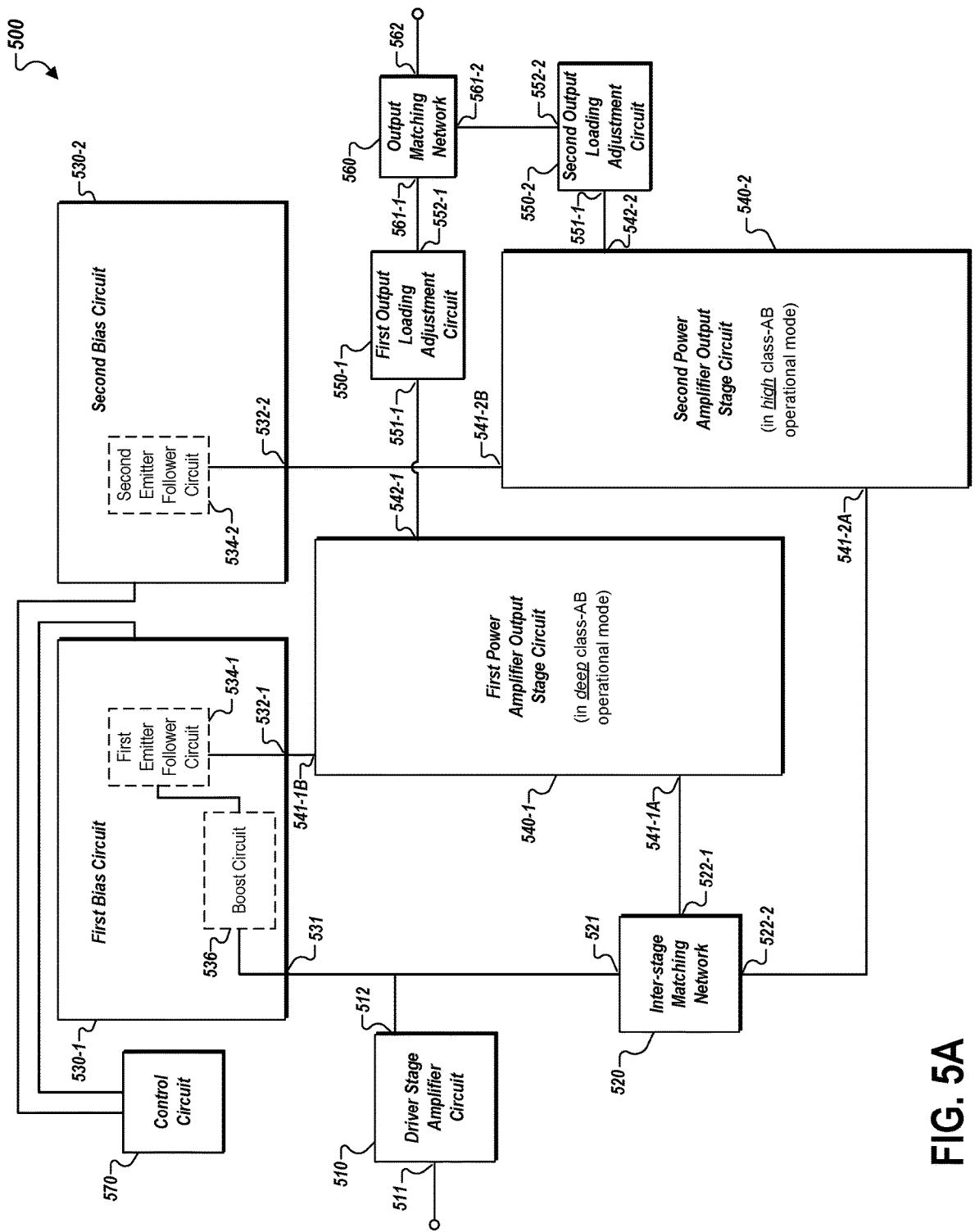
FIGS. 5A-5B are block diagrams of an example hybrid configurable RF power amplifier.
Figure 5B:
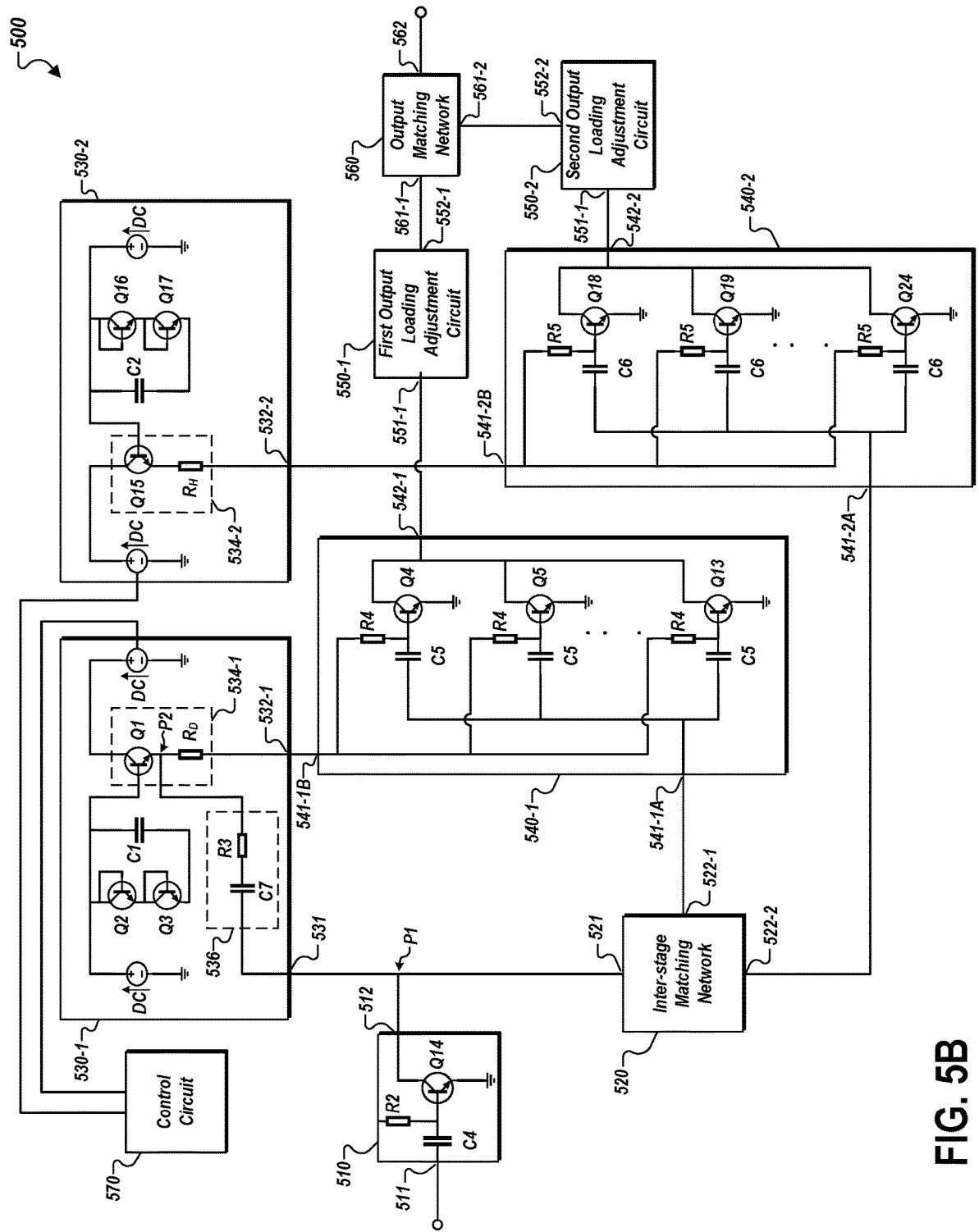

FIGS. 5A-5B are diagrams of an example hybrid configurable RF power amplifier 500. In the example of FIGS. 5A-5B, the RF power amplifier 500 includes a driver stage amplifier circuit 510, an inter-stage impedance matching network 520, a first bias circuit 530-1, a second bias circuit 530-2, a first power amplifier output stage circuit 540-1, a second power amplifier output stage circuit 540-2, a first output loading adjustment circuit 550-1, a second output loading adjustment circuit 550-2, an output impedance matching network 560, and a control circuit 570. In some implementations, each of one or more of elements 510 to 521, 560, and 562 as depicted in FIGS. 5A-5B is similar or equivalent to each of one or more of elements 410 to 421, 450, and 452 as depicted in FIGS. 4A-4B, respectively. And, as mentioned above, in some implementations, each of one or more of elements 410 to 421, 450, and 452 as depicted in FIGS. 4A-4B is similar or equivalent to each of one or more of elements 310 to 321, 350, and 352 as depicted in FIGS. 3A-3B, respectively. As mentioned above, in some implementations, the RF power amplifier 500 can correspond to the power amplifier 216 as described above with reference to FIG. 2, which may be implemented in wireless device 110 as described above with reference to FIG. 1 or another similar wireless device.

In some implementations, one or both of the first bias circuit 530-1 and the first power amplifier output stage circuit 540-1 as depicted in FIGS. 5A-5B are similar or equivalent to one or both of the bias circuit 430 and the power amplifier output stage circuit 440 as depicted in FIGS. 4A-4B, respectively. It follows that, in at least some of the aforementioned implementations, each of one or more of elements 531, 532-1, 534-1, 536, 541-1A, 541-1B, and 542-1 as depicted in FIGS. 5A-5B is similar or equivalent to each of one or more of elements 431, 432, 434, 436, 441A, 441B, and 442 as depicted in FIGS. 4A-4B, respectively. Indeed, as mentioned above, the first bias circuit 530-1 and the first power amplifier output stage circuit 540-1 may, at least in part, represent circuitry that enables deep class-AB operation. Notably, as shown in FIG. 5B, resistor $R_D$ is employed as the resistor in the first emitter follower circuit 534-1 of the first bias circuit 534-1. Additional discussion of such a resistor is provided above. As such, when activated or otherwise utilized, e.g., in either the first or second modes, the first bias circuit 530-1 and the first power amplifier output stage circuit 540-1 may be configured to set a quiescent point, e.g., quiescent current, of each of BJTs Q4 to Q13 in the first power amplifier output stage circuit 540-1 to a value that corresponds to deep class-AB operation.

Similarly, in some implementations, one or both of the second bias circuit 530-2 and the second power amplifier output stage circuit 540-2 as depicted in FIGS. 5A-5B are similar or equivalent to one or both of the bias circuit 330 and the power amplifier output stage circuit 340 as depicted in FIGS. 3A-3B, respectively. It follows that, in at least some of these implementations, each of one or more of elements 532-2, 534-2, 541-2A, 541-2B, and 542-2 as depicted in FIGS. 5A-5B is similar or equivalent to each of one or more of elements 332, 334, 341A, 341B, and 342 as depicted in FIGS. 3A-3B, respectively. Indeed, as mentioned above, the second bias circuit 530-2 and the second power amplifier output stage circuit 540-2 may, at least in part, represent circuitry for high class-AB operation. Notably, as shown in FIG. 5B, resistor RH is employed as the resistor in the second emitter follower circuit 534-2 of the second bias circuit 534-2. As described in further detail above, the resistance value of resistor Ru is less than that of resistor $R_D$, e.g., the resistance value of resistor $R_D$ may be two to four times greater than the resistance value of resistor RH. Additional discussion of such a resistor is provided above. As such, when activated or otherwise utilized, e.g., in either the first mode, the second bias circuit 530-2 and the second power amplifier output stage circuit 540-2 may be configured to set a quiescent point, e.g., quiescent current, of each of BJTs Q18 to Q24 in the second power amplifier output stage circuit 540-2 to a value that is associated with high class-AB operation. This value may, for example, be greater than the value associated with deep class-AB operation to which each of BJTs Q4 to Q13 in the first power amplifier output stage circuit 540-1 may be set.

As shown in FIG. 5A, the control circuit 570 is communicatively coupled to each of the first bias circuit 530-1 and the second bias circuit 530-2. In some implementations, the control circuit 570 corresponds to a digital CMOS controller. The control circuit 570 is configured to control one or more parameters of one or both of the first and the second bias circuits 530-1, 530-2 to cause the first and second power amplifier output stage circuits 540-1, 540-2 to switch between the first mode and the second mode. In some implementations, the control circuit 570 receives a control signal (e.g., from a processor, such as processor 240 in FIG. 2) that specifies a level of power of an RF signal that is to be provided as output by the RF power amplifier 500 and controls the one or more aforementioned parameters based on the control signal's specification of the level of power of the RF signal that is to be provided. As mentioned above, in some examples, such a determined level of power may correspond to "Pout" as described below with reference to FIG. 6. In some implementations, the processor 240 can determine the level of power of an RF signal that is to be provided as output by the RF power amplifier 500 based at least in part on a level of output power specified in one or more messages received by the wireless device 110. For instance, such one or more messages may originate from the at least one base station 120, the at least one access point 130, or another device in communication with the wireless device 110. In at least some of the aforementioned implementations, the control circuit 570 may evaluate the specified level of power included in the control signal against one or more threshold values to determine whether to invoke the first or second mode of operation in the RF power amplifier 500. For example, the control circuit 570 may be configured to cause the first and second power amplifier output stage circuits 540-1, 540-2 to (i) operate in the first mode in response to determining that the specified level of power satisfies (e.g., is greater than or equal to) one or more threshold values, and (ii) operate in the second mode in response to determining that the specified level of power does not satisfy (e.g., is less than) one or more threshold values. In some examples, each of one or more of the aforementioned threshold values may correspond to a value that is less than or equal to the saturated output power of the circuitry for the deep class-AB operation, e.g., the first bias circuit 530-1 and the first power amplifier output stage circuit 540-1.

In some examples, the control circuit 570 maintains or otherwise has access to one or more lookup tables that indicate the manner in which to control the one or more parameters of one or both of the first and the second bias circuits 530-1, 530-2 to configure the hybrid RF power amplifier (and in particular, the first and second power amplifier output stage circuits 540-1 and 540-2) based upon the specified level of power, e.g., Pout (e.g., which is determined by a processor, such as the processor 240 of FIG. 2). For instance, such one or more lookup tables may specify the values to which the one or more parameters of one or both of the first and the second bias circuits 530-1, 530-2 are to be set in order to deliver optimum efficiency and linearity at the determined level of power at the output of the RF power amplifier 500. In at least some of the aforementioned examples, the control circuit 570 can consult such one or more lookup tables in addition to or instead of evaluating the specified level of power against one or more threshold values. Other configurations are possible.

As depicted in further detail in FIG. 5B, in some implementations, the control circuit 570 is communicatively coupled to one or more DC current sources of the first bias circuit 530-1 and one or more DC current sources of the second bias circuit 530-2. In these implementations, the one or more parameters that are controlled by the control circuit 570 so as to selectively invoke the first or second mode of operation in the RF power amplifier 500 may correspond to one or more parameters of the aforementioned DC current sources. For instance, the control circuit 570 may control the DC current source that is coupled to the collector terminal of transistor Q15 in the second bias circuit 530-2 to output a first amount of current in the first mode and output a second, different amount of current in the second mode. For example, the aforementioned first amount of current may be greater in value than the aforementioned second amount of current. As such, the value of the first amount of current may be high enough so as to place the second power amplifier output stage circuit 540-2 in an activated state in which the second power amplifier output stage circuit 540-2 is configured to amplify an RF input signal, while the value of the second amount of current may not be high enough so as to place the second power amplifier output stage circuit 540-2 in such an activated state. In some implementations, the value of the aforementioned second amount of current may be substantially equal to zero. In some examples, the control circuit 570 may control the DC current source that is coupled to the collector terminal of transistor Q1 in the first bias circuit 530-1 to output an amount of current in both the first and second modes that may be high enough in value so as to place the first power amplifier output stage circuit 540-1 in an activated state in which the first power amplifier output stage circuit 540-1 is configured to amplify an RF input signal. In some implementations, the control circuit 570 may control the DC current source that is coupled to the collector terminal of transistor Q1 in the first bias circuit 530-1 to output the same amount of current in both the first and second modes, while in other implementations, the control circuit 570 may control the DC current source that is coupled to the collector terminal of transistor Q1 in the first bias circuit 530-1 to output the different amounts of current in the first and second modes.

The first and second output loading adjustment circuits 550-1, 550-2 may serve to minimize the presence of adverse effects that might otherwise occur in the first power amplifier output stage circuit 540-1 when transitioning between the first and second modes of operation. The first output loading adjustment circuit 550-1 connects the output 542-1 of the first power amplifier output stage circuit 540-1 to a first input 561-1 of the output matching network 560, and the second output loading adjustment circuit 550-2 connects the output 542-2 of the second power amplifier output stage circuit 540-2 to a second input 561-2 of the output matching network 560. In some examples, the first and second output loading adjustment circuits 550-1, 550-2 may include different components or components of different values than one another. In some implementations, the inter-stage impedance matching network 521 may incorporate circuitry that is analogous to the first and second output loading adjustment circuits 550-1, 550-2 and also serves to minimize the presence of adverse effects that might otherwise occur in the RF power amplifier 500 when transitioning between the first and second modes of operation. In such implementations, a first output 522-1 of the inter-stage impedance matching network 521 may connect to a first source loading adjustment circuit of the inter-stage impedance matching network 521 and a second output 522-2 of the inter-stage impedance matching network 521 may connect to a second source loading adjustment circuit of the inter-stage impedance matching network 521. In the aforementioned implementations, the first and second source loading adjustment circuits (not shown) may be two separate branches of circuitry that are connected to inter-stage impedance matching network circuitry located upstream in much the same way that the first and second output loading adjustment circuits 550-1, 550-2 are two separate branches of circuitry that are connected to the output impedance matching network 560 located downstream. Like the first and second output loading adjustment circuits 550-1, 550-2, the first and second source loading adjustment circuits (not shown) may include different components or components of different values than one another. Other configurations are possible.

In some implementations, the first and second power amplifier output stage circuits 540-1, 540-2 include different quantities of BJTs. For example, the first power amplifier output stage circuit 540-1 may include an array of nine BJTs, while the second power amplifier output stage circuit 540-2 may include an array of six BJTs. Furthermore, in some examples, the one or more parameters that are controlled by the control circuit 570 may include one or more parameters other than those of one or more of the DC current sources of the RF power amplifier 500. Other configurations for selectively invoking the first and second modes of operation in the RF power amplifier 500 are possible.

Figure 6:
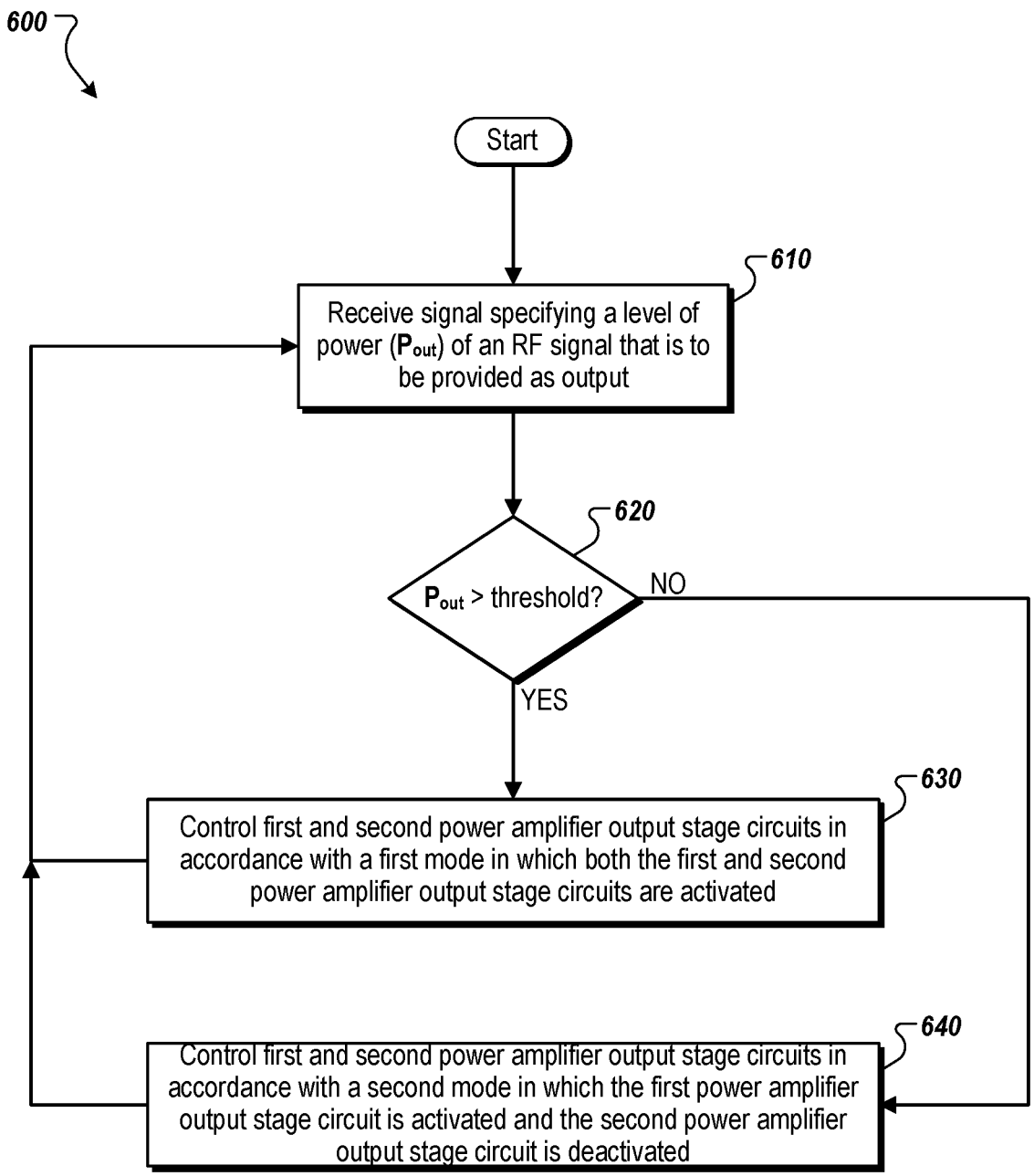
FIG. 6 is a flow diagram of an example process for controlling the operation of a hybrid configurable RF power amplifier.

FIG. 6 is a flow diagram of an example process 600 for controlling the operation of a hybrid configurable RF power amplifier. In some implementations, the aforementioned hybrid RF power amplifier may correspond to an RF power amplifier that is similar or equivalent to the RF power amplifier 500 as described above with reference to FIGS. 5A and 5B. Operations of process 600 are described below as being performed by the components of the system described and depicted in FIGS. 5A and 5B, such as the control circuit 570. Operations of the process 600 are described below for illustration purposes only. Operations of the process 600 can be performed by any appropriate device or system, e.g., any appropriate data processing apparatus, such as one or more devices or systems that are similar or equivalent to the processor 240 as described above with reference to FIG. 2. Operations of the process 600 can also be implemented as instructions stored on a computer readable medium which may be non-transitory. Execution of the instructions causes one or more data processing apparatus to perform operations of the process 600. For purposes of example, operations of process 600 are described below as being performed by the control circuit 570 as described above with reference to FIGS. 5A and 5B.

The control circuit 570 receives a control signal specifying a level of power (Pout) of an RF signal that is to be provided as output (610). For example, this may correspond to one or more operations that are similar or equivalent to one or more operations that are performed in connection with the control circuit 570 receiving the control signal specifying the level of power (Pout) of an RF signal that is to be provided as output by the RF power amplifier 500 based at least in part on a level of output power specified in one or more messages received by the wireless device 110, one or more other factors, or a combination thereof. For instance, such one or more messages may originate from the at least one base station 120, the at least one access point 130, or another device in communication with the wireless device 110.

The control circuit 570 determines whether Pout (specified in the control signal) satisfies (e.g., is greater than or equal to) one or more threshold values (620).

In response to determining, at 620, that Pout satisfies one or more threshold values, the control circuit 570 controls first and second power amplifier output stage circuits in accordance with a first mode in which both the first and second power amplifier output stage circuits are activated (630). For example, this may correspond to one or more operations that are similar or equivalent to one or more operations that are performed in connection with the control circuit 570 controlling each of one or more parameters of the first and second bias circuits 530-1, 530-2 such that both the first and second power amplifier output stage circuits 540-1, 540-2 are activated. As described above, in some implementations, the control circuit 570 controls both the DC current source that is coupled to the collector terminal of transistor Q1 in the first bias circuit 530-1 and the DC current source that is coupled to the collector terminal of transistor Q15 in the second bias circuit 530-2 to output current of a high enough value so as to place both of the first and second power amplifier output stage circuits 540-1, 540-2 in an activated state in which the first and second power amplifier output stage circuits 540-1, 540-2 are each configured to amplify an RF input signal.

On the other hand, in response to determining, at 620, that Pout does not satisfy (e.g., is less than) one or more threshold values, the control circuit 570 controls first and second power amplifier output stage circuits in accordance with a second mode in which the first power amplifier output stage circuit is activated and the second power amplifier output stage circuit is deactivated (640). For example, this may correspond to one or more operations that are similar or equivalent to one or more operations that are performed in connection with the control circuit 570 controlling each of one or more parameters of the first and second bias circuits 530-1, 530-2 such that both the first amplifier output stage circuits 540-1 is activated and the second power amplifier output stage circuit 540-2 is deactivated. As described above, in some implementations, the control circuit 570 controls the DC current source that is coupled to the collector terminal of transistor Q1 in the first bias circuit 530-1 to output current of a high enough value so as to place the first power amplifier output stage circuit 540-1 in an activated state in which the first power amplifier output stage circuits 540-1 is configured to amplify an RF input signal, but does not control the DC current source that is coupled to the collector terminal of transistor Q15 in the second bias circuit 530-2 to output current of a high enough value so as to place the second power amplifier output stage circuit 540-2 in an activated state in which the second power amplifier output stage circuits 540-2 is configured to amplify an RF input signal.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage media (or medium) for execution by, or to control the operation of, data processing apparatus. Alternatively, or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A radio frequency (RF) power amplifier comprising:
a driver stage amplifier circuit;
a first power amplifier output stage circuit comprising a first array of bipolar junction transistors (BJTs);
a second power amplifier output stage circuit comprising a second array of BJTs;
an inter-stage impedance matching network connecting an output of the driver stage amplifier circuit to a first input of the first power amplifier output stage circuit and to a first input of the second power amplifier output stage circuit;
a first bias circuit connecting the output of the driver stage amplifier circuit to a second input of the first power amplifier output stage circuit, wherein the first bias circuit and the first power amplifier output stage circuit are configured to set a first quiescent point of each BJT in the first array of BJTs to a first value; and a second bias circuit coupled to a second input of the second power amplifier output stage circuit, wherein the second bias circuit and the second power amplifier output stage circuit are configured to set a second quiescent point of each BJT in the second array of BJTs to a second value different from the first value.

2. The RF power amplifier of claim 1, further comprising:
a control circuit communicatively coupled to each of the first bias circuit and the second bias circuit, the control circuit configured to control the first and second power amplifier output stage circuits to switch between a first mode and a second mode, wherein:
in the first mode, the control circuit activates both the first and second power amplifier output stage circuits; and
in the second mode, the control circuit activates the first power amplifier output stage circuit and deactivates the second power amplifier output stage circuit.

3. The RF power amplifier of claim 2, wherein the control circuit configured to control the first and second power amplifier output stage circuits to switch between the first mode and the second mode, comprises:
the control circuit configured to control one or more parameters of one or both of the first bias circuit and the second bias circuit to cause the first and second power amplifier output stage circuits to switch between the first mode and the second mode.

4. The RF power amplifier of claim 3, wherein the control circuit is configured to control the one or more parameters of one or both of the first and second bias circuits based on a level of power of an RF signal that is to be provided as output.

5. The RF power amplifier of claim 3, wherein:
the first and second bias circuits include first and second DC current sources, respectively; and
the one or more parameters of one or both of the first and second bias circuits include an output current of the second DC current source.

6. The RF power amplifier of claim 2, wherein the control circuit is further configured to:
receive a control signal specifying that a level of power of an RF signal exceeds a particular power threshold; and
in response to receiving the control signal specifying that the level of power of the RF signal exceeds the particular power threshold, the control circuit is configured to control the first and second power amplifier output stage circuits to operate in the first mode.

7. The RF power amplifier of claim 2, wherein the control circuit is further configured to:
receive a control signal specifying that a level of power of an RF signal is less than a particular power threshold; and
in response to receiving the control signal specifying that the level of power of the RF signal is less than the particular power threshold, the control circuit is configured to control the first and second power amplifier output stage circuits to operate in the second mode.

8. The RF power amplifier of claim 2, wherein the second value is greater than the first value.

9. The RF power amplifier of claim 8, wherein to set the second quiescent point of each BJT in the second array of BJTs to the second value, the second bias circuit and the second power amplifier output stage circuit are configured to cause each BJT in the second array of BJTs to operate in a class-AB mode.

10. The RF power amplifier of claim 1, wherein:
the first bias circuit comprises a first set of components, including a first load element located between first one or more other components in the first set of components and the second input of the first power amplifier output stage circuit, the first load element having a first resistance value; and
the second bias circuit comprises a second set of components, including a second load element located between second one or more other components in the second set of components and the second input of the second power amplifier output stage circuit, the second load element having a second resistance value that is less than the first resistance value.

11. The RF power amplifier of claim 1, wherein:
the first bias circuit is configured to provide a bias voltage to the second input of the first power amplifier output stage circuit; and
the first bias circuit further comprises:
an emitter follower circuit including a transistor, wherein the emitter follower circuit is configured to provide a first voltage; and
a boost circuit configured to sample an RF signal from the output of the driver stage amplifier circuit and pass the sampled RF signal to the emitter follower circuit for rectification from which a second voltage is generated, wherein the second voltage is proportional to a magnitude of a level of power exhibited by the RF signal and the bias voltage is a combination of the first voltage and the second voltage.

12. The RF power amplifier of claim 1, further comprising:
an output impedance matching network combining an output of the first power amplifier output stage circuit with an output of the second power amplifier output stage circuit.

13. A terminal comprising:
a receiver configured to receive one or more messages from a base station;
a transmitter configured to transmit RF signals to the base station, the transmitter comprising an RF power amplifier; and
at least one processor that is operatively connected to the receiver and the transmitter;
wherein the RF power amplifier comprises:
a first power amplifier output stage circuit comprising a first array of bipolar junction transistors (BJTs);
a first bias circuit coupled to the first power amplifier output stage circuit, wherein the first bias circuit and the first power amplifier output stage circuit, when activated, are configured to set a first quiescent point of each BJT in the first array of BJTs to a first value;
a second power amplifier output stage circuit comprising a second array of BJTs;
a second bias circuit coupled to the second power amplifier output stage circuit, wherein the second bias circuit and the second power amplifier output stage circuit, when activated, are configured to set a second quiescent point of each BJT in the second array of BJTs to a second value, the second value being greater than the first value; and
a control circuit communicatively coupled to each of the first bias circuit and the second bias circuit, the control circuit is configured to control the first and second power amplifier output stage circuits to operate in accordance with a first mode and a second mode based on an output power level, wherein:
in the first mode, both the first and second power amplifier output stage circuits are activated; and in the second mode, the first power amplifier output stage circuit is activated and the second power amplifier output stage circuit is deactivated.

14. The terminal of claim 13, wherein:
the at least one processor is configured to:
   determine that the output power level is greater than one or more threshold values; and
   send, to the RF power amplifier, a signal specifying that the output power level of the RF signal is greater than the one or more threshold values;
the control circuit of the RF power amplifier is configured to:
   receive, from the at least one processor, the signal specifying that the output power level of the RF signal is greater than the one or more threshold values; and
   in response to receiving the signal specifying that the output power level is greater than the one or more threshold values, the control circuit is configured to control the first and second power amplifier output stage circuits to operate in the first mode.

15. The terminal of claim 13, wherein:
the at least one processor is configured to:
   determine that the output power level is less than one or more threshold values; and
   send, to the RF power amplifier, a signal specifying that the output power level of the RF signal is less than the one or more threshold values;
the control circuit of the RF power amplifier is configured to:
   receive, from the at least one processor, the signal specifying that the output power level of the RF signal is less than the one or more threshold values; and
   in response to receiving the signal specifying that the output power level is less than the one or more threshold values, the control circuit is configured to control the first and second power amplifier output stage circuits to operate in the second mode.

16. The terminal of claim 13, wherein the at least one processor is configured to determine the output power level based at least in part on the one or more messages received from the base station.

17. The terminal of claim 16, wherein the output power level is specified in the one or more messages from the base station.

18. The terminal of claim 13, wherein to set the second quiescent point of each BJT in the second array of BJTs to the second value, the second bias circuit and the second power amplifier output stage circuit are configured to cause each BJT in the second array of BJTs to operate in a class-AB mode.

* * * * *